(12) United States Patent
Kroeger

(10) Patent No.: US 7,043,681 B2
(45) Date of Patent: May 9, 2006

(54) DIGITAL AUDIO BROADCASTING METHOD AND APPARATUS USING COMPLEMENTARY PATTERN-MAPPED CONVOLUTIONAL CODES

(75) Inventor: Brian William Kroeger, Sykesville, MD (US)

(73) Assignee: iBiquity Digital Corporation, Columbia, MD (US)

( * ) Notice: Subject to any disclaimer, the term of this patent is extended or adjusted under 35 U.S.C. 154(b) by 846 days.

(21) Appl. No.: 10/138,898

(22) Filed: May 3, 2002

(65) Prior Publication Data

US 2003/0212946 A1 Nov. 13, 2003

(51) Int. Cl.
*H03M 13/25* (2006.01)

(52) U.S. Cl. ........................ 714/786; 375/265
(58) Field of Classification Search ................. 714/792; 375/265
See application file for complete search history.

(56) References Cited

U.S. PATENT DOCUMENTS

| | | | |
|---|---|---|---|
| 5,305,352 A | 4/1994 | Calderbank et al. |
| 5,396,518 A | 3/1995 | How |
| 5,408,502 A | 4/1995 | How |
| 5,446,747 A | 8/1995 | Berrou |
| 5,497,401 A | 3/1996 | Ramaswamy et al. |
| 5,588,022 A | 12/1996 | Dapper et al. |
| 5,633,881 A | 5/1997 | Zehavi et al. |
| 5,668,820 A | 9/1997 | Ramesh et al. |
| 5,812,601 A | 9/1998 | Schramm |
| 5,859,876 A | 1/1999 | Dapper et al. |
| 5,878,085 A | 3/1999 | McCallister et al. |

(Continued)

OTHER PUBLICATIONS

G. Ungerboeck, "A Channel Coding with Multilevel/Phase Signals," *IEEE Transactions on Information Theory*, vol. IT–28, No. 1, Jan. 1982, pp. 55–67.

J. Hagenauer, "Rate–Compatible Punctured Convolutional Codes (RCPC Codes) and their Applications," *IEEE Transactions on Communications*, vol. 36, No. 4, Apr. 1988, pp. 389–400.

A. Viterbi et al., "A Pragmatic Approach to Trellis–Coded Modulation," *IEEE Communications Magazine*, vol. 27, No. 7, Jul. 1989, pp. 11–19.

S. Kallel, "Complementary Punctured Convolutional (CPC) Codes and Their Applications," *IEEE Transactions on Communications*, vol. 43, No. 6, Jun. 1995, pp. 2005–2009.

B. Kroeger et al., "Robust Modem and Coding Techniques for FM Hybrid IBOC DAB," *IEEE Trans. on Broadcasting*, vol. 43, No. 4, Dec. 1997, pp. 412–420.

B. Chen et al., "An Integrated Error Correction and Detection System for Digital Audio Broadcasting," *IEEE Trans. on Broadcasting*, vol. 46, No. 1, Mar. 2000, pp. 68–78.

U.S. Appl. No. 09/438,822, filed Nov. 10, 1999, Kroeger et al.

*Primary Examiner*—Stephen M. Baker
(74) *Attorney, Agent, or Firm*—Robert P. Lenart, Esq.; Pietragallo, Bosick & Gordon

(57) ABSTRACT

A method of transmitting digital information comprises the steps of forward error correction encoding a plurality of bits of digital information using complementary pattern-mapped convolutional codes, modulating a plurality of carrier signals with the forward error corrected bits, and transmitting the carrier signals. The modulation can include the step of independently amplitude shift keying in-phase and quadrature components of the QAM constellation using Gray code constellation points corresponding to amplitude levels. Transmitters that transmit signals in accordance with the method and receivers that receive such signals are also included.

25 Claims, 8 Drawing Sheets

U.S. PATENT DOCUMENTS

| | | |
|---|---|---|
| 5,909,454 A | 6/1999 | Schmidt |
| 5,910,967 A | 6/1999 | Vanderaar |
| 5,949,796 A | 9/1999 | Kumar |
| 6,005,894 A | 12/1999 | Kumar |
| 6,005,897 A | 12/1999 | McCallister et al. |
| 6,097,764 A | 8/2000 | McCallister et al. |
| 6,108,810 A | 8/2000 | Kroeger et al. |
| 6,158,041 A | 12/2000 | Raleigh et al. |
| 6,170,076 B1 | 1/2001 | Kim |
| 6,202,189 B1 | 3/2001 | Hinedi et al. |
| 6,236,685 B1 | 5/2001 | Oppedahl |
| 6,243,424 B1 | 6/2001 | Kroeger et al. |
| 6,269,125 B1 | 7/2001 | Seccia et al. |
| 6,269,129 B1 | 7/2001 | Rhee et al. |
| 6,292,917 B1 | 9/2001 | Sinha et al. |
| 6,347,122 B1 | 2/2002 | Chen et al. |
| 6,353,637 B1 | 3/2002 | Mansour et al. |
| 2002/0025005 A1 | 2/2002 | Onggosanusi et al. |

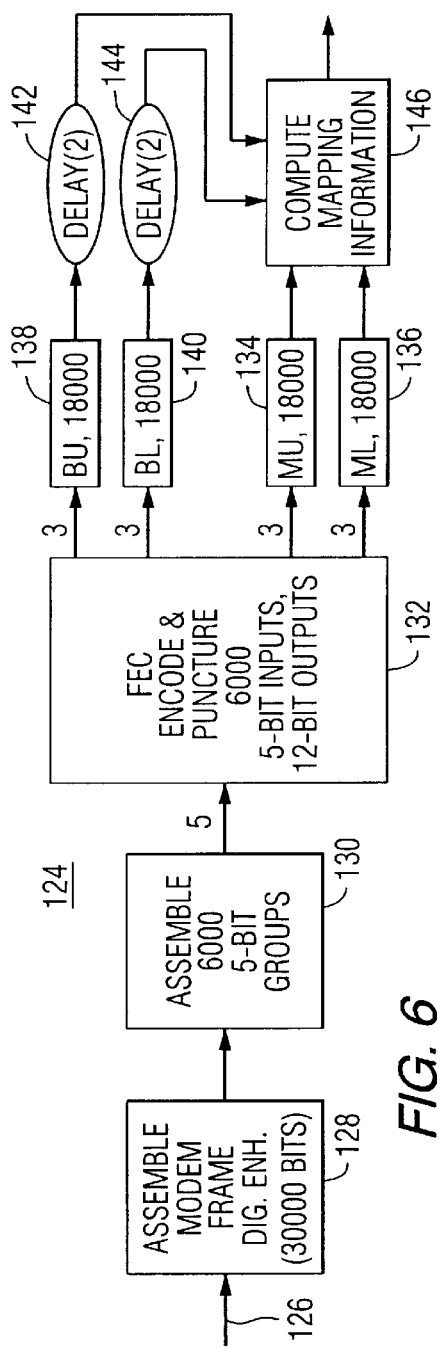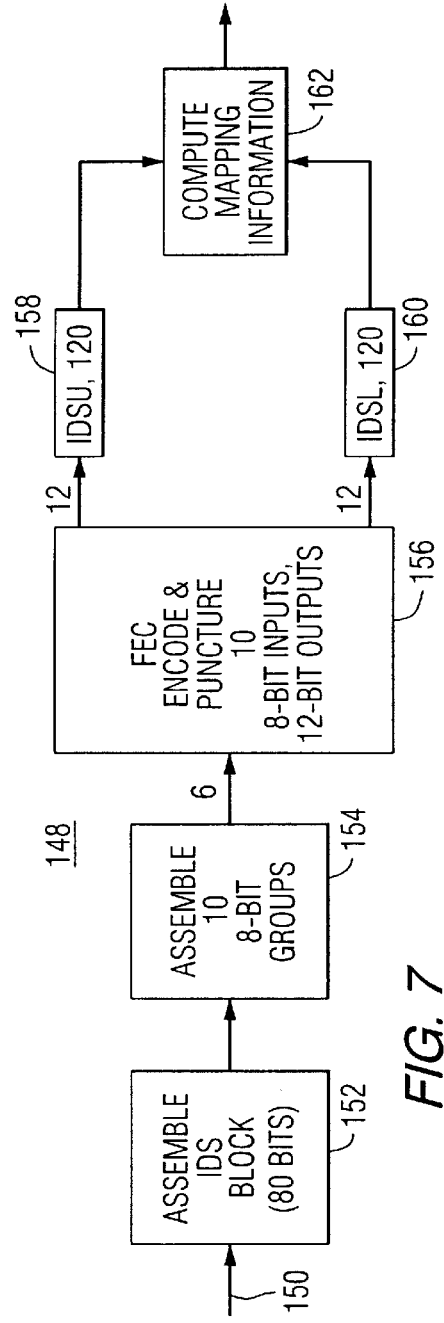
FIG. 6
FIG. 7

DIGITAL AUDIO BROADCASTING METHOD AND APPARATUS USING COMPLEMENTARY PATTERN-MAPPED CONVOLUTIONAL CODES

BACKGROUND OF THE INVENTION

This invention relates to methods and apparatus for coding digital information and more particularly to such methods and apparatus for use in digital audio broadcasting systems Digital Audio Broadcasting (DAB) is a medium for providing digital-quality audio, superior to existing analog broadcasting formats. Both AM and FM In-Band On-Channel (IBOC) DAB signals can be transmitted in a hybrid format where the digitally modulated signal coexists with the currently broadcast analog signal, or in an all-digital format without the analog signal. IBOC DAB requires no new spectral allocations because the digitally modulated signal and the analog signal are simultaneously transmitted within the spectral mask of an existing channel allocation. IBOC DAB promotes economy of spectrum while enabling broadcasters to supply digital quality audio to their present base of listeners.

An orthogonal frequency division multiplex (OFDM) technique has been described for IBOC DAB. OFDM signals include orthogonally spaced carriers modulated at a common symbol rate. The frequency spacing for symbol pulses (e.g., BPSK, QPSK, 8 PSK or QAM) is proportional to the symbol rate. For hybrid IBOC transmission of AM compatible DAB signals, sets of OFDM sub-carriers are placed within about 5 kHz to 15 kHz on either side of a coexisting analog AM carrier, and additional OFDM sub-carriers are placed within a ±5 kHz frequency band occupied by the analog modulated AM carrier.

DAB systems utilize forward error correction (FEC) and interleaving to improve the reliability of the transmitted digital information over corrupted channels. Most conventional convolutional codes have been designed to perform well with binary signaling in an additive white noise Gaussian (AWGN) channel. The simplest codes have rate of 1/n, where each input information bit produces n output bits. Punctured codes can be constructed by removing code bits from a rate 1/N "mother code" to produce a higher rate code. S. Kallel, "Complementary Punctured Convolutional (CPC) Codes and Their Applications," IEEE Trans. Comm., Vol. 43, No. 6, pp. 2005–2009, June 1995, described a technique for producing complementary codes, which employs a sort of puncturing technique to create good component codes.

B. Kroeger, D. Cammarata, "Robust Modem and Coding Techniques for FM Hybrid IBOC DAB," IEEE Trans. on Broadcasting, Vol. 43, No. 4, pp. 412–420, December 1997 described a technique to create overlapping component codes without all of Kallel's requirements on the complementary property. In U.S. patent application Ser. No. 09/438,822 (WIPO International Publication No. WO 01/35555), Kroeger et al. have also shown that these codes can be mapped onto QAM symbols using a Pragmatic Trellis Code Modulation (PTCM) technique described by Viterbi et al., in "A Pragmatic Approach to Trellis-Coded Modulation", A. Viterbi et al. IEEE Communications Magazine, pp. 11–19, Vol. 27, No. 7, July 1989, while also preserving the complementary-like properties.

The free distance (dfree) of a convolutional code (punctured or non-punctured) is a convenient metric to gauge error correction performance in an AWGN channel with binary signaling (e.g. BPSK or QPSK). Secondary metrics such as the number of paths at the free distance, and the number of errors on those paths are used to resolve finer performance differences. The Optimum Distance Profile is also useful, especially for codes with large constraint length. When nonbinary signaling is used, such as QAM in an AWGN channel, the minimum Euclidean distance metric through the trellis paths is significantly more appropriate. Unfortunately trellis code modulation (TCM) and PTCM were designed for AWGN channels and do not perform well in impulsive noise. This is because the PTCM (or TCM) codes provide no error protection on the most significant bits with the larger uncoded Euclidean distances in the QAM constellation. Hamming distance is more important for error protection in an impulsive noise channel.

There is a need for a coding technique that overcomes these limitations and is suitable for use in IBOC DAB systems.

SUMMARY OF THE INVENTION

This invention provides a method of transmitting digital information comprising the steps of forward error correction encoding a plurality of bits of digital information using complementary pattern-mapped convolutional codes, modulating a plurality of carrier signals with the forward error corrected bits, and transmitting the carrier signals.

Forward error correction can be accomplished by defining a plurality of code partitions, selecting a puncture size compatible with the partitions, finding noncatastrophic partition codes, and mapping in-phase and quadrature components of the noncatastrophic codes to a QAM constellation. The modulation preferably includes the step of independently amplitude shift keying in-phase and quadrature components of the QAM constellation using Gray code amplitude levels.

Forward error correction can also include the steps of deleting predetermined bits in the plurality of bits to produce a modified plurality of bits, allocating the modified plurality of bits among a plurality of partitions, and mapping in-phase and quadrature components of the modified plurality of bits to a QAM constellation.

The invention also encompasses transmitters comprising means for forward error correction encoding a plurality of bits of digital information using complementary pattern-mapped convolutional codes, means for modulating a plurality of carrier signals with the forward error corrected bits, and means for transmitting the carrier signals.

Another aspect of the invention includes a method of receiving an information signal comprising the steps of receiving a plurality of carrier signals modulated by a plurality of complementary pattern-mapped convolutional coded bits, demodulating the carrier signals to recover the complementary pattern-mapped convolutional coded bits, and producing an output signal based on the complementary pattern-mapped convolutional coded bits. The demodulating steps can include the step of passing the complementary pattern-mapped convolutional coded bits through a nonlinear limiter.

The invention further encompasses receivers for receiving an information signal comprising means for receiving a plurality of carrier signals modulated by a plurality of complementary pattern-mapped convolutional coded bits, means for demodulating the carrier signals to recover the complementary pattern-mapped convolutional coded bits, and means for producing an output signal based on the complementary pattern-mapped convolutional coded bits.

The invention overcomes the limitations of prior art pragmatic trellis coded modulation by exploiting the contribution of each bit in the puncture pattern toward the code free distance when these bits are assigned nonbinary values, related to the Euclidean distance of the bits mapped to the signaling constellation.

BRIEF DESCRIPTION OF THE DRAWINGS

FIG. 6 is a block diagram illustrating the functionality of an all-digital enhancement layer of 30 kHz AM IBOC system;

FIG. 7 is a block diagram illustrating the functionality of a forward error correction (FEC) interleaver for an integrated digital services (IDS) channel in an AM IBOC system;

DESCRIPTION OF THE PREFERRED EMBODIMENTS

This invention provides a Forward Error Correction (FEC) technique that can be utilized in AM compatible IBOC (In-Band On-Channel) DAB (Digital Audio Broadcast) systems. This FEC technique is referred to herein as Complementary Pattern-mapped Trellis-Coded Modulation (CPTCM). The CPTCM coding is designed to accommodate the likely interference scenarios encountered in an AM IBOC DAB channel.

Figure 1:
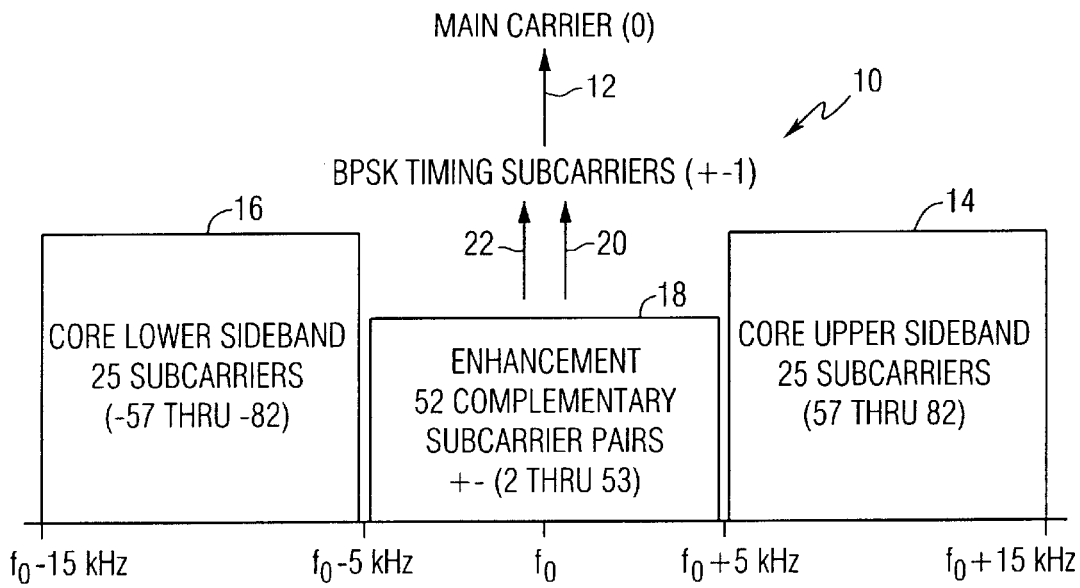
FIG. 1 is a schematic representation of the subcarrier assignments for a hybrid AM in-band on-channel digital audio broadcasting system.

Referring to the drawings, FIG. 1 is a schematic representation of the subcarrier assignments for a hybrid AM in-band on-channel (IBOC) digital audio broadcasting system. The hybrid IBOC DAB signal 10 includes a main carrier 12 at frequency $f_o$, that is analog modulated by a program signal in accordance with conventional AM broadcasting techniques. The signal also includes a plurality of evenly spaced subcarriers that are transmitted in the same channel as the analog modulated signal. First and second groups of subcarriers are positioned in upper and lower sidebands 14 and 16, respectively, and are referred to as the core subcarriers. A third group of subcarriers, referred to as enhancement subcarriers, is located in a central band 18, that is also occupied by the analog modulated carrier. The subcarriers in the first and second groups are modulated both in-phase and in quadrature with respect to the analog modulated carrier. The subcarriers in the third group are arranged in complementary pairs and modulated in quadrature with the analog modulated carrier. Two subcarriers 20 and 22 of the third group that lie closest to the center of the channel are referred to as timing subcarriers and are modulated using BPSK modulation. A digital audio broadcasting system that utilizes complementary carriers is disclosed in U.S. Pat. No. 5,859,876, which is hereby incorporated by reference.

Figure 2:
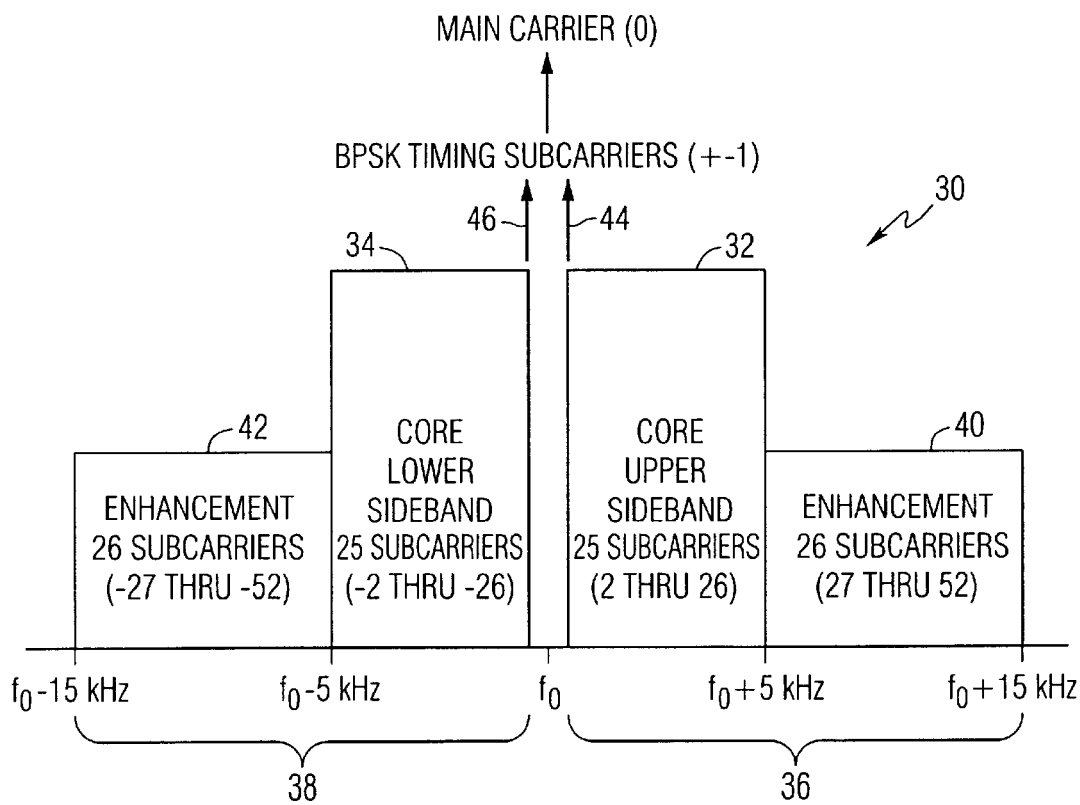
FIG. 2 is a schematic representation of the subcarrier assignments for an all-digital in-band on-channel digital audio broadcasting system.

FIG. 2 is a schematic representation of the subcarrier assignments for an all-digital in-band on-channel (IBOC) digital audio broadcasting system. The all-digital IBOC DAB signal 30 includes first and second groups 32 and 34 of evenly spaced subcarriers, referred to as the core subcarriers, that are positioned in upper and lower sidebands 36 and 38. Third and fourth groups 40 and 42 of subcarriers, referred to as enhancement subcarriers, are also positioned in upper and lower sidebands 36 and 38. Two timing subcarriers 44 and 46 of the third group that lie closest to the center of the channel and are modulated using BPSK modulation.

The AM IBOC DAB signal is digitally modulated using COFDM (Coded Orthogonal Frequency Division Multiplexing). Each of the subcarriers is modulated using 64-QAM symbols. The digital information (e.g. audio) is interleaved in partitions, and then FEC coded using complementary pattern-mapped trellis coded modulation (CPTCM). The CPTCM method of forward error correction (FEC) is based upon a combination of a new code pattern-mapping technique, and application of Complementary Punctured Codes to IBOC DAB systems, expanding the complementary-like properties to two dimensions.

The basic requirements for the CPTCM code in IBOC DAB systems, include the ability to puncture the original code in various overlapping partitions including Main, Backup, Lower Sideband and Upper Sideband. Each of the four overlapping partitions must survive as a good code. The Lower and Upper Sidebands should be optimized as a pair of complementary non-overlapping partitions. Similarly, the Backup and Main partitions should survive independently. Of course, all partitions should be noncatastrophic codes. A digital audio broadcasting system that uses partitioning is disclosed in the previously mentioned U.S. patent application Ser. No. 09/438,822, and is hereby incorporated by reference.

Figure 3:
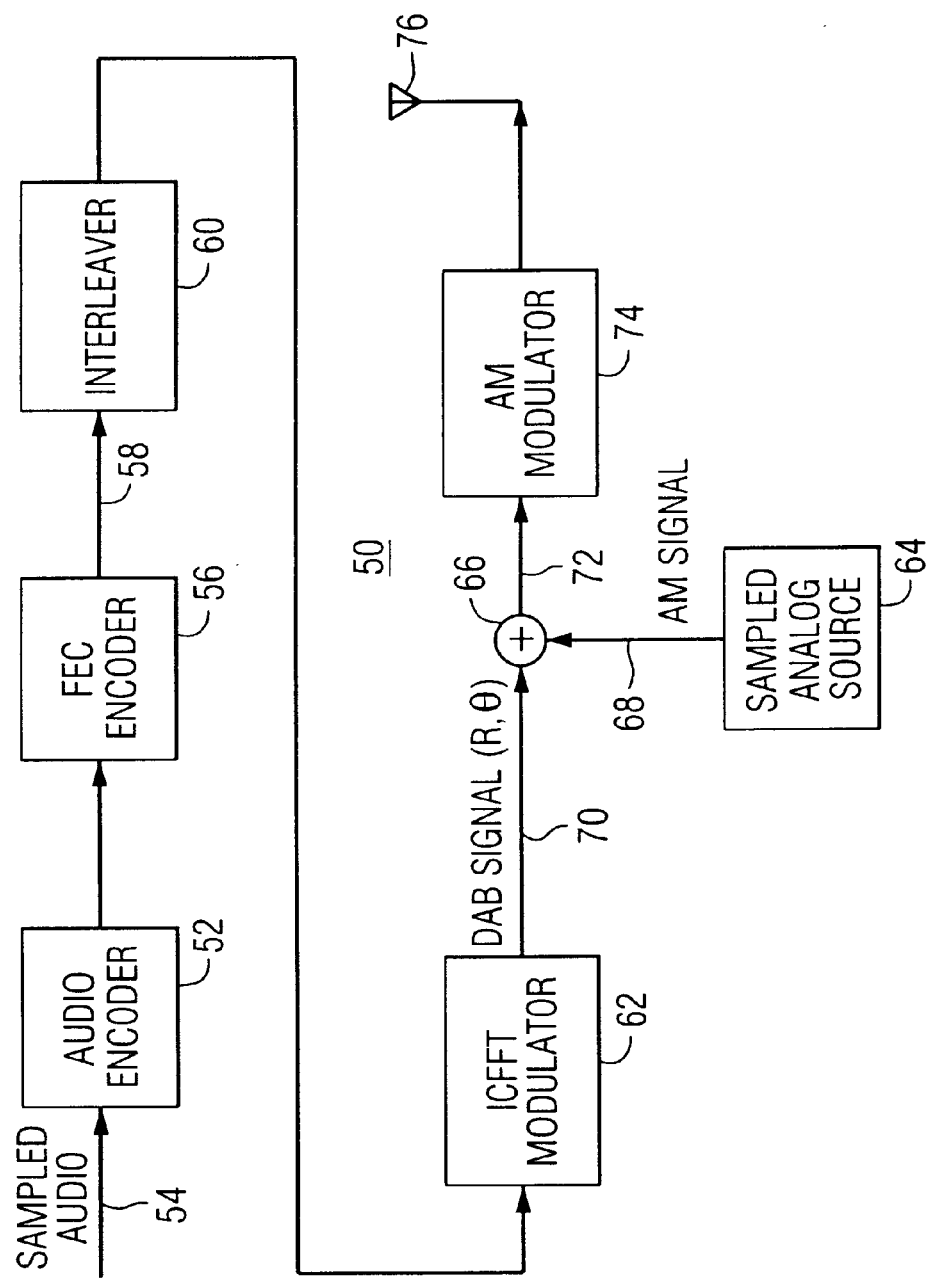
FIG. 3 is a simplified block diagram of relevant portions of an IBOC DAB transmitter which can incorporate the method of the present invention.

FIG. 3 is a simplified block diagram of relevant portions of an IBOC DAB transmitter 50 which can incorporate the method of the present invention. The transmitter includes an audio encoder 52 that receives a sampled audio signal on line 54. The encoded signal on line 54 is subjected to forward error correction as illustrated by FEC encoder 56. The resulting forward error corrected signal on line 58 is then interleaved as illustrated by interleaver 60. Modulator 62 modulates the interleaved signal. In the hybrid system, a sampled audio source 64 supplies and AM signal to summation point 66 where the AM signal on line 68 and the digitally modulated signal on line 70 are combined to produce a composite signal on line 72 that is then modulated by modulator 74 and broadcast through antenna 76. It will be recognized that although the functions shown in FIG. 3 are shown in separate blocks, the functions can be performed using one or more processors, where multiple functions are performed in one processor.

Figure 4:
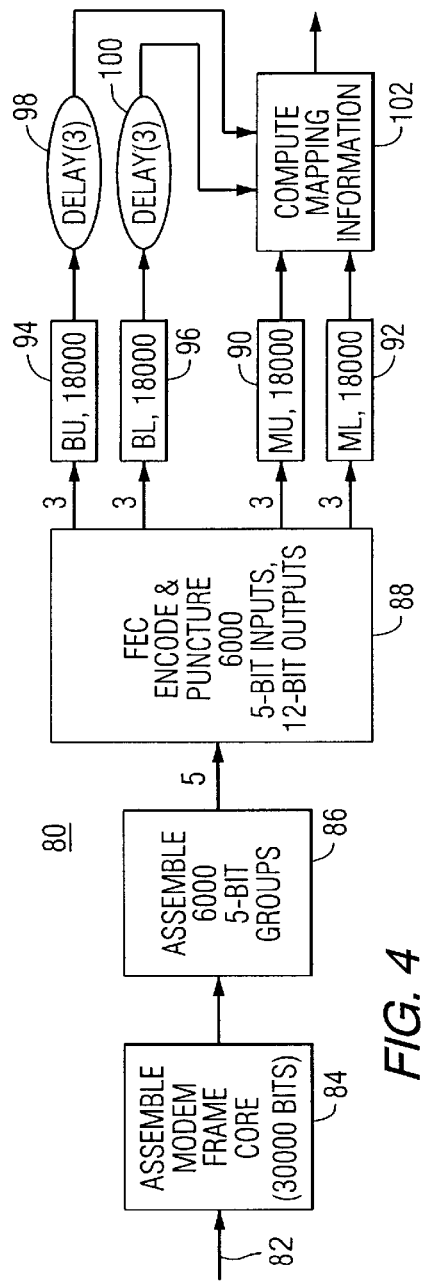
FIG. 4 is a block diagram illustrating the functionality of a forward error correction (FEC) interleaver for a core layer of a 30 kHz AM IBOC system.

FIG. 4 is a functional block diagram illustrating a forward error correction (FEC) interleaver 80 for a core layer of a 30 kHz AM IBOC system. A digital signal is supplied on line 82 and assembled into a modem frame core containing, for example, 3000 bits, as illustrated by block 84. The modem frame is then divided into a plurality of bit groups as illustrated by block 86, wherein the modem frame is shown to be divided into 6000 5-bit groups. The groups are then subjected to forward error encoding and puncturing as illustrated by block 88.

Punctured convolutional codes are derived from a rate 1/N "mother code", by removal of some of the code bits. The punctured code bits can be identified in a puncture pattern, which repeats periodically. The puncture period P is the number of information bits in the puncture pattern. The total number of bits in the puncture pattern is P·N. The resulting code rate of the punctured code is:

$$\frac{k}{n} = \frac{P}{P \cdot N - x};$$

where x is the number of punctured code bits.

The particular bits to be punctured should be chosen carefully to minimize the loss in error correction performance of the resulting punctured code. Further, it is important to avoid creating a catastrophic code by puncturing. For example the removal of one particular bit may result in a free distance loss of 1, while removal of a different bit may result in a loss of 3, and the removal of yet a different bit may result in a catastrophic code. Clearly, all code bit locations in the puncture pattern do not contribute equally to the error correction performance of the punctured code. This property can be exploited in the mapping of code bits to nonbinary signaling such as ASK or QAM.

In the example illustrated in FIG. 4, each of the 5-bit groups results in a 12-bit output. The 12-bit groups are then partitioned into main-upper, main-lower, backup-upper and backup-lower partitions as illustrated by blocks 90, 92, 94 and 96, for example by allocating three bits of each 12-bit group to each of the partitions. The backup-upper and backup-lower bits are delayed as illustrated by blocks 98 and 100, and the bits are mapped into a core interleaver as shown by block 102.

Figure 5:
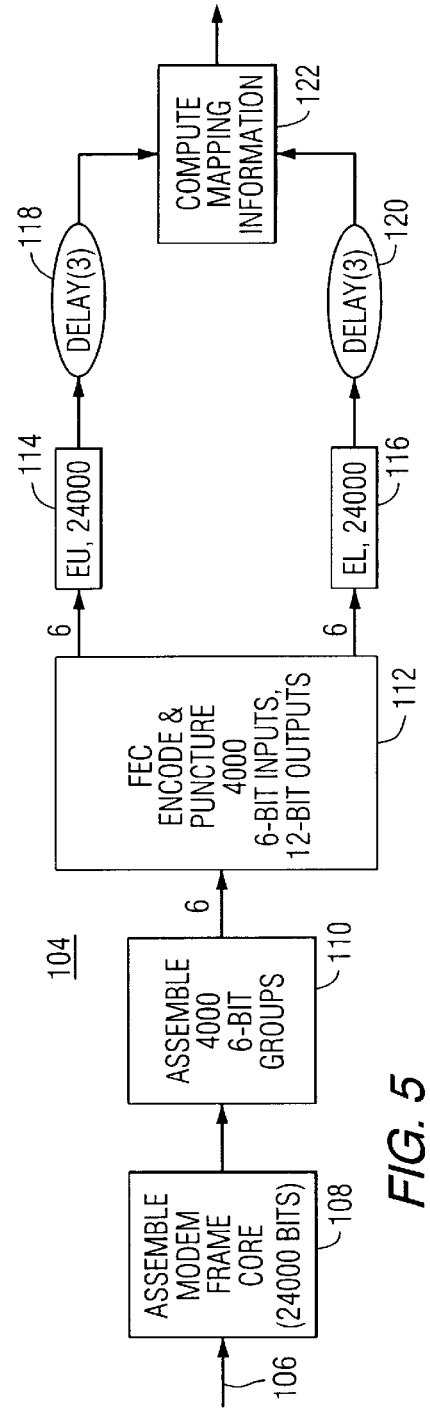
FIG. 5 is a block diagram illustrating the functionality of a forward error correction (FEC) interleaver for a hybrid enhancement layer of a 30 kHz AM IBOC system.

FIG. 5 is a functional block diagram illustrating forward error correction (FEC) for an enhancement interleaver 104 for an AM hybrid IBOC system. A digital signal is supplied on line 106 and assembled into a modem frame core containing, for example, 24000 bits, as illustrated by block 108. The modem frame is then divided into a plurality of bit groups as illustrated by block 110, wherein the modem frame is shown to be divided into 4000 6-bit groups. The groups are then subjected to forward error encoding and puncturing as illustrated by block 112. In the example, each of the 6-bit groups results in a 12-bit output. The 12-bit groups are then partitioned into enhancement-upper and enhancement-lower partitions as illustrated by blocks 114 and 116, for example by allocating six bits of each 12-bit group to each of the partitions. The enhancement-upper and enhancement-lower bits are delayed as illustrated by blocks 118 and 120, and the bits are mapped into an enhancement interleaver as shown by block 122.

FIG. 6 is a functional block diagram illustrating a forward error correction (FEC) interleaver 124 for an enhancement layer of an all-digital AM IBOC system. A digital signal is supplied on line 126 and assembled into a modem frame core containing, for example, 3000 bits, as illustrated by block 128. The modem frame is then divided into a plurality of bit groups as illustrated by block 130, wherein the modem frame is shown to be divided into 6000 5-bit groups. The groups are then subjected to forward error encoding and puncturing as illustrated by block 132. In the example of FIG. 6, each of the 5-bit groups results in a 12-bit output. The 12-bit groups are then partitioned into main-upper, main-lower, backup-upper and backup-lower partitions as illustrated by blocks 134, 136, 138 and 140, for example by allocating three bits of each 12-bit group to each of the partitions. The backup-upper and backup-lower bits are delayed as illustrated by blocks 142 and 144, and the bits are mapped into a core interleaver as shown by block 146.

FIG. 7 is a functional block diagram illustrating forward error correction (FEC) for an integrated data service (IDS) interleaver 148 for an AM hybrid IBOC system. A digital signal is supplied on line 150 and assembled into a modem frame core containing, for example, 80 bits, as illustrated by block 152. The modem frame is then divided into a plurality of bit groups as illustrated by block 154, wherein the modem frame is shown to be divided into ten 8-bit groups. The groups are then subjected to forward error encoding and puncturing as illustrated by block 156. In the example, each of the 8-bit groups results in a 24-bit output. The 24-bit groups are then partitioned into IDS-upper and IDS-lower partitions as illustrated by blocks 158 and 160, for example by allocating six bits of each 12-bit group to each of the partitions. The IDS-upper and IDS-lower bits are then mapped into an enhancement interleaver as shown by block 162.

Figure 8:
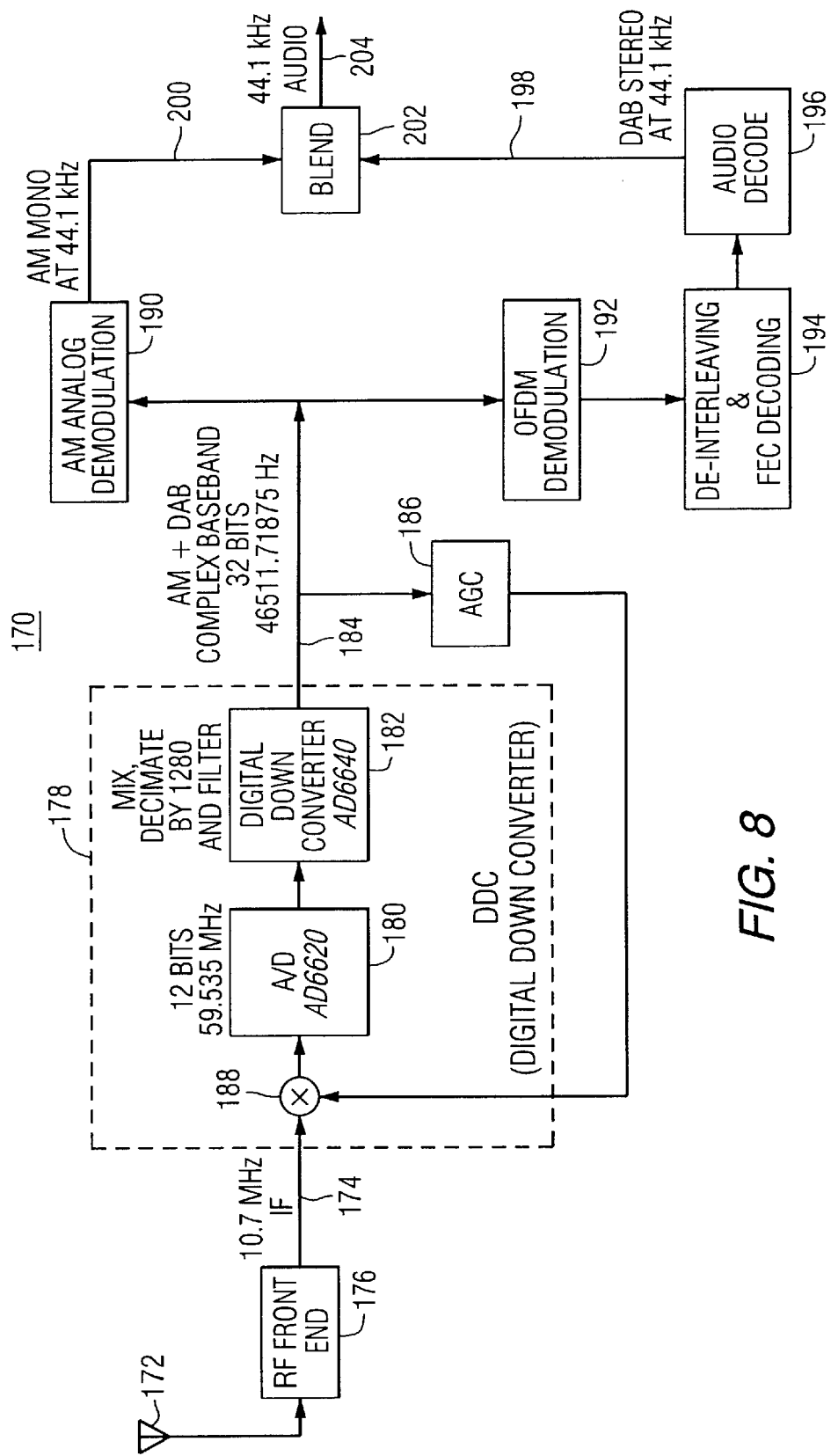
FIG. 8 is a simplified block diagram of relevant portions of an IBOC DAB receiver which can receive signals coded in accordance with the method of the present invention.

FIG. 8 is a simplified block diagram of relevant portions of an IBOC DAB receiver 170 which can receive signals coded in accordance with the method of the present invention. The composite broadcast signal is received by antenna 172 and converted to an intermediate frequency (IF) signal on line 174 by front end circuit 176. The IF signal is then processed by a digital down converter 178 that includes an analog to digital converter 180 and a processor that performs mixing, decimation and filtering as illustrated by block 182 to produce a complex baseband signal on line 184. An automatic gain control 186 feeds the baseband signal back to a multiplier 188 in the digital down converter. Demodulator 190 demodulates the analog modulated portion of the complex baseband signal and demodulator 192 demodulates the digitally modulated portion of the complex baseband signal. After deinterleaving, FEC decoding, and audio decoding as illustrated by blocks 194 and 196, the resulting DAB stereo signal on line 198 and the analog signal on line 200 are blended as illustrated by block 202 to produce an audio output on line 204.

Figure 9:
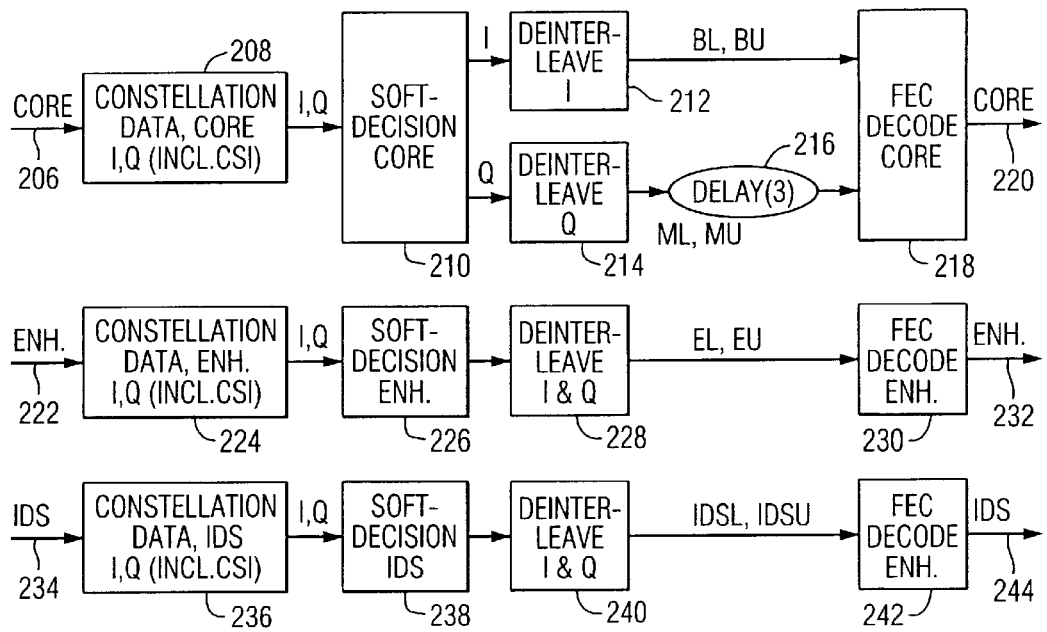
FIG. 9 is a block diagram illustrating the functionality of an AM IBOC hybrid deinterleaver and FEC decoder implementation that permits rapid acquisition of the core audio.

FIG. 9 is a functional block diagram of an AM IBOC hybrid deinterleaver and FEC decoder. The interleaved and forward error corrected core signal is input on line 206 and demodulated into in-phase (I) and quadrature (Q) components as illustrated in block 208. Block 210 shows that soft decisions for the I and Q components are determined and the I and Q soft decisions are deinterleaved in blocks 212 and 214 respectively. The deinterleaved quadrature components for the main upper and main lower partitions are delayed as illustrated by block 216, and the deinterleaved forward error corrected core signals are decoded as illustrated by block 218 to produce the core data on line 220.

The interleaved and forward error corrected enhancement signal is input on line 222 and demodulated into in-phase (I) and quadrature (Q) components as illustrated in block 224. Block 226 shows that soft decisions for the I and Q components are determined, and the I and Q soft decisions are deinterleaved in block 228. The deinterleaved enhancement signals are forward error correction decoded as illustrated by block 230 to produce the enhancement data on line 232.

The interleaved and forward error corrected IDS signal is input on line 234 and demodulated into in-phase (I) and quadrature (Q) components as illustrated in block 236. Block 238 shows that soft decisions for the I and Q components are determined, and the I and Q soft decisions are deinterleaved in block 240. The deinterleaved forward error corrected IDS signals are decoded as illustrated by block 242 to produce the integrated data service data on line 244.

Figure 10:
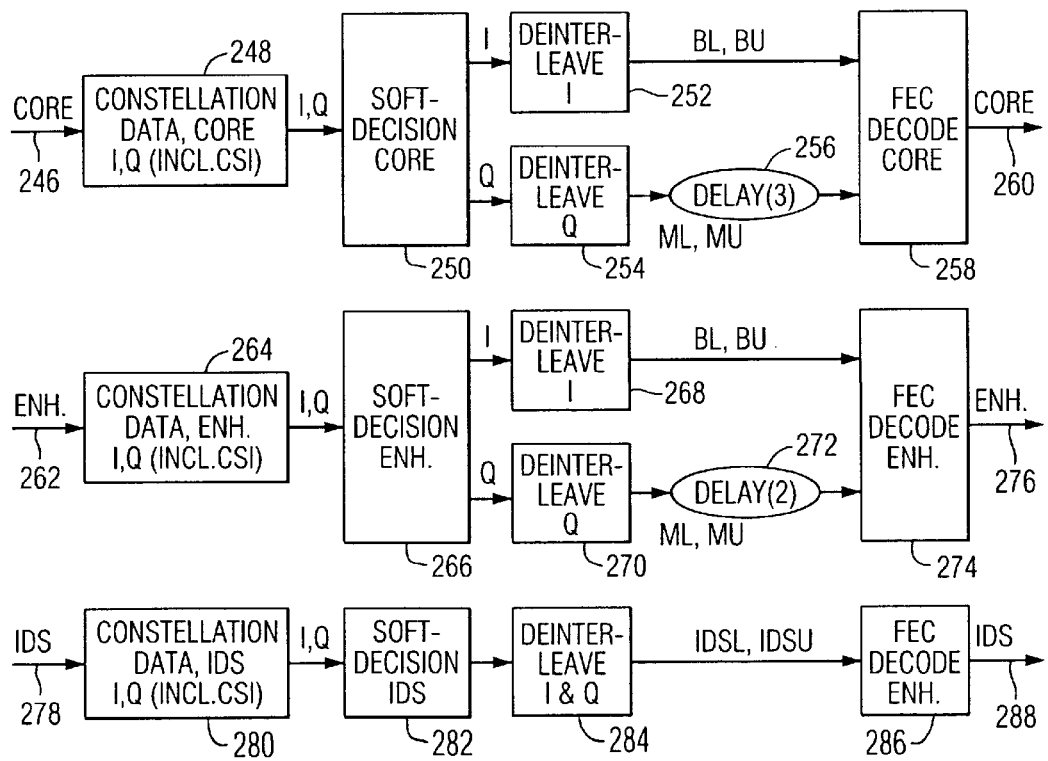
FIG. 10 is a block diagram illustrating the functionality of another AM IBOC hybrid deinterleaver and FEC decoder implementation that permits rapid acquisition of the core audio.

FIG. 10 is a functional block diagram of an alternative AM IBOC hybrid deinterleaver and FEC decoder. The interleaved and forward error corrected core signal is input on line 246 and demodulated into in-phase (I) and quadrature (Q) components as illustrated in block 248. Block 250 shows that soft decisions for the I and Q components are determined, and the I and Q soft decisions are deinterleaved in blocks 252 and 254 respectively. The deinterleaved quadrature components for the main upper and main lower partitions are delayed as illustrated by block 256, and the deinterleaved forward error corrected core signals are decoded as illustrated by block 258 to produce the core data on line 260.

The interleaved and forward error corrected enhancement signal is input on line 262 and demodulated into in-phase (I) and quadrature (Q) components as illustrated in block 264. Block 266 shows that soft decisions for the I and Q components are determined and the I and Q soft decisions are deinterleaved in blocks 268 and 270 respectively. The deinterleaved quadrature components for the main upper and main lower partitions are delayed as illustrated by block 272, and the deinterleaved enhancement signals are forward error correction decoded as illustrated by block 274 to produce the enhancement data on line 276.

The interleaved and forward error corrected IDS signal is input on line 278 and demodulated into in-phase (I) and quadrature (Q) components as illustrated in block 280.

Block 282 shows that soft decisions for the I and Q components are determined, and the I and Q soft decisions are deinterleaved in block 284. The deinterleaved forward error corrected IDS signals are decoded as illustrated by block 286 to produce the IDS data on line 288.

Designing the CPTCM code is a multi-step process. First the partitions are defined, for example Main, Backup, Lower, and Upper partitions. In the coded orthogonal frequency division multiplexing (COFDM) example, the partitions are defined as groups of subcarriers that are affected together as a group by an interference scenario. Specifically, if coded subcarriers are placed on both the lower and upper sidebands, one of these sidebands can be corrupted by an interferer while the other sideband is expected to survive on its own. In other words, the code in each sideband should not be catastrophic, and should have good error correction properties on its own. Therefore each partition must constitute a code rate less than or equal to 1. Similarly a pair of partitions may be time diverse, where one partition is transmitted first (e.g. Main), and the other partition is transmitted several seconds later (e.g. Backup). In this case the signal can experience an outage for a second (e.g. as a receiver passes under a bridge) and either the Backup or Main partition will survive because they don't experience the outage over the same content information due to time diversity. Different pairs or sets of partitions can overlap. For example the Upper/Lower and Main/Backup partition pairs can overlap each other. More particularly, the Lower partition can be comprised of half of the Main partition bits plus half of the Backup partition bits, while the Upper partition comprises the remaining bits.

Next, a puncture pattern size (code rate and puncture period) is selected to accommodate the partitions. If a code is comprised of two mutually exclusive partitions (e.g. Main, Backup) each of code rate R. Then the composite code is rate R/2. The Mother code from which the partitions are formed by puncturing must have a rate no greater than R/2. Typically the Mother code is a convolutional code of rate 1/n. The partitions need not include sets of code bits that are mutually exclusive. The period of the puncture pattern must be sufficiently large to form each of the partitions.

Then noncatastrophic partition components are found, ideally with maximum free distance, dfree. This would involve a computer search, with possibly multiple good results and combinations from which to select.

For nonbinary code bit modulations, the best bit mapping for the possible noncatastrophic partitions would be determined. Binary modulation such as BPSK or QPSK does not benefit from the mapping of code bits to the modulation symbol. QAM is a nonbinary modulation where, in this code design, the in-phase (I) and quadrature phase (Q) components of the QAM symbol are treated individually as ASK symbols. Each ASK symbol carries b code bits forming an m-ary ASK symbol of $m=2^b$ amplitude levels which are Gray-coded. This involves placing various soft weights on the bits, instead of hard-decision (±1). A method of determining a relative "soft" free distance is described below.

The best mappings compatible with the partitioning that yield the maximum "soft" dfree are then selected. Unfortunately, the ideal mappings of bits to symbols within each partition may not be consistent with the bit mapping in other partitions. For example, not all partitions can use the bits with the greatest average Euclidean distance. There are additional restrictions when partitions overlap. These restriction will likely result in a compromise in the bit mapping for each of the partitions. In some cases it may be desirable that one partition have a better mapping than another (e.g. Backup can be improved at the expense of Main performance).

The CPTCM technique is applied to a QAM symbol by treating the I and Q components as independently coded ASK signals. Specifically the 64-QAM symbol is created by modulating the I or Q component with independent 8-ASK signals. The 8-ASK symbols are generated from specially selected 3-bit groups which are then used to address the Gray-mapped constellation points. The Gray mapping maximizes performance by minimizing the number of decision boundaries in the ASK mapping. This maximizes the average Euclidean distance. This is clearly different from either the set partitioning suggested by Ungerboeck in "Channel Coding with Multilevel/Phase Signals," IEEE Transactions on Information Theory, Vol. IT-28, No. 1, January 1982, pp. 55–67, or the multi-level coding and PTCM mapping suggested in the previously mentioned article by Viterbi et al. The mapping of the code bit triplets to the 8 levels of the 8-ASK symbols is presented in Table 1.

TABLE 1

Mapping of CPTCM-coded bits to 8 levels of the 8-ASK symbols.

| MAPPING | Level -3.5 | Level -2.5 | Level -1.5 | Level -0.5 | Level 0.5 | Level 1.5 | Level 2.5 | Level 3.5 |
|---|---|---|---|---|---|---|---|---|
| A | 0 | 0 | 0 | 0 | 1 | 1 | 1 | 1 |
| B | 0 | 0 | 1 | 1 | 1 | 1 | 0 | 0 |
| C | 0 | 1 | 1 | 0 | 0 | 1 | 1 | 0 |

The 16-QAM symbol is created by modulating the I or Q components with independent 4-ASK signals. The 4-ASK symbols are generated from specially selected 2-bit groups which are then used to address the Gray-mapped constellation points. The mapping of the code bit pairs to the 4 levels of the 4-ASK symbols is presented in Table 2.

TABLE 2

Mapping of CPTCM-coded bits to 4 levels of the 4-ASK symbols.

| MAPPING | Level -1.5 | Level -0.5 | Level +0.5 | Level +1.5 |
|---|---|---|---|---|
| A | 0 | 0 | 1 | 1 |
| B | 0 | 1 | 1 | 0 |

The mapping of the code bits to ASK levels is described next. Gray-code mapping is used to assign ASK levels to bit triplets or bit pairs. Gray mapping is a well-known method of assigning bits to address levels (ASK levels in this example) where the ordering of the levels requires the minimal number of changes of bits. Specifically, exactly one bit changes between the address of successive levels. In contrast, a binary number assignment of addresses has no such restriction. In the 8-ASK example, Gray coding results in 7 bit changes between the 8 levels, not counting the end points. A binary number ordering of levels involves 11 bit changes, not counting the endpoints.

Gray coding is known to be beneficial upon detection of the ASK signals in noise since the most likely bit estimation errors are made when the level is near a bit transition. It is further observed that more transitions (m/2) occur in the least significant bit (LSB) of the Gray-mapped m-ASK symbol, while only one transition occurs in the most significant bit (MSB). Therefore the LSB is more prone to errors caused by noise than the MSB. Thus the MSB is more reliable than the LSB, and the other bits are between these extremes. This property is exploited in the method of this invention.

In addition to exploiting the unequal error-correcting property of the code bits through puncturing, the invention also uses this property to map the code bits to the ASK symbols (bit address triplets or pairs). The most valuable code bits are placed in the most reliable MSB locations, and the least valuable bits in the LSB locations. This should tend to minimize the loss in error correcting ability of the resulting code and modulation. The main benefit of this technique over TCM or PTCM is that a good Hamming distance can be maintained. TCM or PTCM are designed to maximize Euclidean distance while allowing a Hamming distance of only 1 on the MSB's. Therefore the MSB's have no error protection which is unacceptable for impulsive noise and offers poor performance in fading. In contrast, the CPTCM technique proposed here is designed to maintain the good Hamming distance of the underlying binary code, while maximizing Euclidean distance under these constraints. Furthermore the CPTCM code is easy to implement since it requires only a single stage of decoding and deinterleaving, unlike the other multistage decoding/deinterleaving techniques of TCM or PTCM.

CPTCM requires an assessment of the relative value of the various code bits within the puncture pattern. For example assume there are 6 code bits in a partition remaining after puncturing the others, and these 6 bits are to be mapped to the bit triplets of the 8-ASK symbols used to create 64-QAM symbols. Then the 6 code bits are placed into 3 categories of reliability, where the most valuable 2 bits are associated with the 2 MSBs, the least valuable 2 bits are associated with the 2 LSBs, and the 2 middle bits are associated with the middle ASK address bits. It is not necessary that the bits are grouped within the same symbols since bit interleaving would be desirable to scatter the burst errors within a symbol.

Next the value of each code bit in a puncture pattern is assessed for subsequent mapping of the code bits to the modulation symbols. Either a code partition is identified or the entire code is used, depending on whether the mapping is to be optimized over each partition individually, or if it is more important to optimize the mapping over the entire code. These two different optimizations will generally yield different mapping results. In a case where it is preferred to optimize the individual partitions, the assessment of the value of the code bits can be done in several ways.

For example, each bit can be removed from the code and the loss in error correction ability can be assessed. In order of importance convenient metrics include catastrophic loss, free distance loss, increased number of paths at the distance. The least valuable bits result in the least loss. These bits would then be ranked to map the least valuable bits to the LSBs, or most vulnerable bits, in the modulation symbols. Alternatively, the bits can be removed in groups instead of one at a time. Another approach would be to use a Viterbi Algorithm to estimate some sort of soft free distance related to Euclidean distance of the code.

When code partitions overlap, generally a compromise must be made for the bit mapping. This is because one partition may prefer a particular bit to be mapped to a MSB modulation symbol address, while that same bit in an overlapping partition may prefer an LSB mapping. Both optimizations cannot be accommodated in these cases and a compromise must be evaluated and established.

Several example code designs are described next using the method(s) described above. These designs include interleaver designs intended for an AM IBOC system. The interleaver can be designed for CPTCM with a scalable (2-layer) audio codec. The interleaver would be comprised of 2 parts: a Core Interleaver spanning 50 subcarriers (25 Upper plus 25 Lower sideband) and an Enhancement Interleaver spanning 50 subcarriers (50 complementary subcarrier pairs for the Hybrid system, and 25 in each the lower and upper "wings" for the All-Digital system). Two additional subcarrier pairs (+−27 & +−53) in the Enhancement region can be used for IDS information and are independent of the Enhancement coding. In this example, subcarriers 2 through 82 on either side of the main carrier are utilized in the 30 kHz system. FIG. 1 illustrates the location of the interleaver partitions for the Hybrid system, while FIG. 2 illustrates the location of the interleaver partitions for the All-Digital system.

The CPTCM codes can be created through puncturing of rate ⅓ convolutional codes. A rate ⅓ code provides a sufficient number of bits in the puncture pattern to form a rate 5/12 code used in the example described above. Although it is possible to use almost any code generator polynomials, a good place to start the search is to use the standard polynomials since they are more likely to produce better punctured codes. The FEC code requires appropriate puncture patterns and code-bit mapping to provide good results in both the Hybrid system and All-Digital system. For the Hybrid system, the puncture pattern would provide code bits for the upper sideband and lower sideband complementary components. Each sideband is required to provide a good quality code in the case of the other sideband being corrupted. The Core code must also be partitioned for diversity with Main and Backup components. Each complementary component can be coded using a rate ⅚ code producing a combined code rate of 5/12. The Core FEC puncture pattern would also be distributed between a Main audio channel and a Backup audio channel. The Backup channel is used for fast tuning and provides time diversity to mitigate the effects of intermittent blockages. The Main and Backup channels each can be coded at a rate of ⅚ resulting in a combined code rate of 5/12. The Upper/Lower partition pair overlaps the Main/Backup partition pair.

A good code including the two overlapping pairs of partitions was found using the Core FEC Composite Puncture Pattern generator polynomials G=[G1=561, G2=753, G3=711]. The combined Main, Backup, Upper, and Lower puncture pattern for the Core FEC code is defined in Table 3. Some examples of some good codes created using these techniques are described next.

TABLE 3

Puncture Pattern.

| BLC | MUB | BLB | BUA | MLC |
|-----|-----|-----|-----|-----|
| BUB | BLA | MLB | MLA | BUC |
| MUC | 0   | MUA | 0   | 0   |

In Table 3, B=Backup, M=Main, L=Lower Sideband, U=Upper Sideband and A, B, and C are the bit positions. Table 4 provides a summary of the core code parameters.

TABLE 4

Core FEC summary of parameters.

| Partition | Rate | $d_f$ | a | c |
|-----------|------|-------|---|---|
| Main      | 5/6  | 4     | 5 | 54 |
| Backup    | 5/6  | 5     | 19 | 168 |
| Lower     | 5/6  | 5     | 19 | 168 |

TABLE 4-continued

Core FEC summary of parameters.

| Partition | Rate | $d_f$ | a | c |
|-----------|------|-------|---|---|
| Upper     | 5/6  | 4     | 5 | 28 |
| Composite | 5/12 |       |   |   |

The overall rate of the Hybrid Upper plus Lower Enhancement FEC code is rate ⅔. The puncture pattern and code-bit assignment is defined in Table 5.

TABLE 5

Puncture Patterns.

| $EL_I$ | $EU_{IA}$ | $EU_{IB}$ | $EU_{QA}$ |
|--------|-----------|-----------|-----------|
| 0      | 0         | 0         | 0         |
| $EL_Q$ | 0         | $EU_{QB}$ | 0         |

In Table 5, E=Extended, L=Lower Sideband, U=Upper Sideband, I=In-Phase, Q=Quadrature, and A and B=bit positions. The Hybrid Enhancement FEC Composite Puncture Pattern was produced using generators G=[G1=561, G2=753, G3=711]. Table 6 provides a summary of the hybrid enhancement code parameters.

TABLE 6

Hybrid Enhancement FEC summary of parameters.

| Partition | Rate | $d_f$ | a | c |
|-----------|------|-------|---|---|
| Upper     | 1    | 1     | 4 | 38 |
| Lower     | 2    | N/A   |   |   |
| Composite | 2/3  | 7     | 20 | 96 |

The FEC coding for the All-Digital Enhancement can be identical to the Core code design. However there is a modification required in the interleaver for framing and delay. This modification is described below with respect to the All-Digital Enhancement interleaver.

The IDS subcarriers can be modulated using 16-QAM symbols as were the Enhancement subcarriers. Subcarriers 27 and 53 (−27 and −53 are complementary) are IDS subcarriers in the Hybrid system. Subcarriers 27 and −27 are noncomplementary IDS subcarriers in the All-Digital system. The IDS Sequence is 32 symbols long (symbols 0 through 31) and associated with a block length of 32 OFDM symbols in the particular interleaver used in this example. Symbols locations 10 and 26 are assigned as Training Symbols. The remaining 30 symbols carry 120 bits of rate ⅔ coded information. Hence each IDS Sequence carries 80 information bits, including an 8-bit CRC. A rate ⅓ code can be employed with rate ⅔ complementary components. The Upper and Lower complementary code components of the All-Digital IDS subcarriers correspond to the Hybrid inner and outer IDS complementary subcarrier pairs, respectively, of the Hybrid. Table 7 illustrates the all-digital IDS puncture pattern.

TABLE 7

Puncture Pattern.

| $IDSL_{IA0}$ | $IDSU_{IA1}$ | $IDSL_{IA1}$ | $IDSU_{IA2}$ | $IDSL_{QA0}$ | $IDSU_{QA1}$ | $IDSL_{QA1}$ | $IDSU_{QA2}$ |
|---|---|---|---|---|---|---|---|
| $IDSL_{IB0}$ | $IDSU_{IB0}$ | $IDSL_{IB2}$ | $IDSU_{IB2}$ | $IDSL_{QB0}$ | $IDSU_{QB0}$ | $IDSL_{QB2}$ | $IDSU_{QB2}$ |
| $IDSU_{IA0}$ | $IDSL_{IB1}$ | $IDSU_{IB1}$ | $IDSL_{IA2}$ | $IDSU_{QA0}$ | $IDSL_{QB1}$ | $IDSU_{QB1}$ | $IDSL_{QA2}$ |

In Table 7, IDS=Integrated Data Service, L=Lower Sideband, U=Upper Sideband, I=In-phase, Q=Quadrature, and A and B are bit positions. The IDS FEC Composite Puncture Pattern was produced using generators G=[G1= 561, G2=753, G3=711]. Table 8 provides a summary of the IDS code parameters.

TABLE 8

Core FEC summary of parameters.

| Partition | Rate | $d_f$ | a | c |
|---|---|---|---|---|
| Upper | 2/3 | 7 | 6 | 26 |
| Lower | 2/3 | 7 | 6 | 26 |
| Composite | 1/3 | 17 | | |

An interleaver block can be comprised of 32 COFDM symbols (bauds). There would be 8 blocks in a Modem Frame (Interleaver span) for the Main and the Enhancement partitions. The Backup partition can be interleaved over only one block span to permit rapid tuning. The Core Interleaver includes an upper sideband and a lower sideband (25 subcarriers each). The Enhancement Interleaver also includes an upper sideband and a lower sideband (25 subcarriers each, excluding the IDS subcarriers) for the All-Digital system, or equivalently an Inner and Outer Enhancement partition for the Hybrid system. Each interleaver block holds a total of 800 QAM symbols (750 data+50 Training).

The scalable audio codec in this example is comprised of two layers (Core and Enhancement). The Core layer is mapped onto 50 QAM subcarriers (25 subcarriers on each sideband) while the Enhancement layer is mapped onto 50 QAM complementary subcarriers (pairs for Hybrid). The Core and Enhancement Layers are coded separately. In addition there are some subcarriers assigned to carry 16-QAM IDS data.

Interleaving within each block spanning 25 subcarriers and 32 OFDM symbols can be performed using the following expressions for the row and column indices:

$$\text{row}(k) = \text{mod}\left[11 \cdot \text{mod}(9 \cdot k, 25) + 16 \cdot \text{floor}\left(\frac{k}{25}\right) + 11 \cdot \text{floor}\left(\frac{k}{50}\right), 32\right]$$

$$\text{col}(k) = \text{mod}[9 \cdot k, 25]$$

$$k = 0 \ldots 749$$

The index k points to one of the 750 QAM symbols within the block (Core or Enhancement). Each of the 64-QAM symbols of the Core carries 6 codes bits, which are mapped within a block. Similarly, each of the 16-QAM symbols of the Enhancement or IDS interleaver carries 4 codes bits which are mapped within blocks using the same expressions. Of the total of 800 symbols in a block, the remaining 50 QAM symbols are used for training symbols. The training symbols can be located in the last 50 QAM symbol locations (k=750 . . . 799).

TABLE 9

Symbol Indices Within A Block; Training Symbol = "T".

| | 0 | 1 | 2 | 3 | 4 | 5 | 6 | 7 | 8 | 9 | 10 | 11 | 12 |
|---|---|---|---|---|---|---|---|---|---|---|---|---|---|
| A = | | | | | | | | | | | | | |
| 0 | 0 | "T" | 728 | 692 | 631 | 595 | 534 | 498 | 437 | 376 | 340 | 279 | 243 |
| 1 | 150 | 114 | 53 | 17 | "T" | 745 | 684 | 648 | 587 | 526 | 490 | 429 | 393 |
| 2 | 300 | 264 | 203 | 167 | 106 | 70 | 9 | "T" | 737 | 676 | 640 | 579 | 543 |
| 3 | 450 | 414 | 353 | 317 | 256 | 220 | 159 | 123 | 62 | 1 | "T" | 729 | 693 |
| 4 | 600 | 564 | 503 | 467 | 406 | 370 | 309 | 273 | 212 | 151 | 115 | 54 | 18 |
| 5 | "T" | 714 | 653 | 617 | 556 | 520 | 459 | 423 | 362 | 301 | 265 | 204 | 168 |
| 6 | 125 | 89 | 28 | "T" | 706 | 670 | 609 | 573 | 512 | 451 | 415 | 354 | 318 |
| 7 | 275 | 239 | 178 | 142 | 81 | 45 | "T" | 723 | 662 | 601 | 565 | 504 | 468 |
| 8 | 425 | 389 | 328 | 292 | 231 | 195 | 134 | 98 | 37 | "T" | 715 | 654 | 618 |
| 9 | 575 | 539 | 478 | 442 | 381 | 345 | 284 | 248 | 187 | 126 | 90 | 29 | "T" |
| 10 | 725 | 689 | 628 | 592 | 531 | 495 | 434 | 398 | 337 | 276 | 240 | 179 | 143 |
| 11 | 50 | 14 | "T" | 742 | 681 | 645 | 584 | 548 | 487 | 426 | 390 | 329 | 293 |
| 12 | 200 | 164 | 103 | 67 | 6 | "T" | 734 | 698 | 637 | 576 | 540 | 479 | 443 |
| 13 | 350 | 314 | 253 | 217 | 156 | 120 | 59 | 23 | "T" | 726 | 690 | 629 | 593 |
| 14 | 500 | 464 | 403 | 367 | 306 | 270 | 209 | 173 | 112 | 51 | 15 | "T" | 743 |
| 15 | 650 | 614 | 553 | 517 | 456 | 420 | 359 | 323 | 262 | 201 | 165 | 104 | 68 |
| 16 | 25 | "T" | 703 | 667 | 605 | 570 | 509 | 473 | 412 | 351 | 315 | 254 | 218 |
| 17 | 175 | 139 | 78 | 42 | "T" | 720 | 659 | 623 | 562 | 501 | 465 | 404 | 368 |
| 18 | 325 | 289 | 228 | 192 | 131 | 95 | 34 | "T" | 712 | 651 | 615 | 554 | 518 |
| 19 | 475 | 439 | 378 | 342 | 281 | 245 | 134 | 148 | 87 | 26 | "T" | 704 | 668 |
| 20 | 625 | 589 | 528 | 492 | 431 | 395 | 334 | 298 | 237 | 176 | 140 | 79 | 43 |
| 21 | "T" | 739 | 678 | 642 | 581 | 545 | 484 | 448 | 387 | 326 | 290 | 229 | 193 |
| 22 | 100 | 64 | 3 | "T" | 731 | 695 | 634 | 598 | 537 | 476 | 440 | 379 | 343 |
| 23 | 250 | 214 | 153 | 117 | 56 | 20 | "T" | 748 | 687 | 626 | 590 | 529 | 493 |
| 24 | 400 | 364 | 303 | 267 | 206 | 170 | 109 | 73 | 12 | "T" | 740 | 679 | 643 |
| 25 | 550 | 514 | 453 | 417 | 356 | 320 | 259 | 223 | 162 | 101 | 65 | 4 | "T" |
| 26 | 700 | 664 | 603 | 567 | 506 | 470 | 409 | 373 | 312 | 251 | 215 | 154 | 118 |
| 27 | 75 | 39 | "T" | 717 | 656 | 620 | 559 | 523 | 462 | 401 | 365 | 304 | 268 |
| 28 | 225 | 189 | 128 | 92 | 31 | "T" | 709 | 673 | 612 | 551 | 515 | 454 | 418 |
| 29 | 375 | 339 | 278 | 242 | 181 | 145 | 84 | 48 | "T" | 701 | 665 | 604 | 568 |
| 30 | 525 | 489 | 428 | 392 | 331 | 295 | 234 | 198 | 137 | 76 | 40 | "T" | 718 |
| 31 | 675 | 639 | 578 | 542 | 481 | 445 | 384 | 348 | 287 | 226 | 190 | 129 | 93 |

TABLE 9-continued

Symbol Indices Within A Block; Training Symbol = "T".

| | 13 | 14 | 15 | 16 | 17 | 18 | 19 | 20 | 21 | 22 | 23 | 24 |
|---|---|---|---|---|---|---|---|---|---|---|---|---|
| A = | | | | | | | | | | | | |
| 0 | 182 | 146 | 85 | 49 | "T" | 702 | 666 | 605 | 569 | 508 | 472 | 411 |
| 1 | 332 | 296 | 236 | 199 | 138 | 77 | 41 | "T" | 719 | 658 | 622 | 561 |
| 2 | 482 | 446 | 385 | 349 | 288 | 227 | 191 | 130 | 94 | 33 | "T" | 711 |
| 3 | 632 | 596 | 535 | 499 | 438 | 377 | 341 | 280 | 244 | 183 | 147 | 86 |
| 4 | "T" | 746 | 685 | 649 | 588 | 527 | 491 | 430 | 394 | 333 | 297 | 236 |
| 5 | 107 | 71 | 10 | "T" | 738 | 677 | 641 | 580 | 544 | 483 | 447 | 386 |
| 6 | 257 | 221 | 160 | 124 | 63 | 2 | "T" | 730 | 694 | 633 | 597 | 536 |
| 7 | 407 | 371 | 310 | 274 | 213 | 152 | 116 | 55 | 19 | "T" | 747 | 686 |
| 8 | 557 | 521 | 460 | 424 | 363 | 302 | 266 | 205 | 169 | 108 | 72 | 11 |
| 9 | 707 | 671 | 610 | 574 | 513 | 452 | 416 | 355 | 319 | 258 | 222 | 181 |
| 10 | 82 | 46 | "T" | 724 | 663 | 602 | 566 | 505 | 469 | 408 | 372 | 311 |
| 11 | 232 | 196 | 135 | 99 | 38 | "T" | 716 | 655 | 619 | 558 | 522 | 461 |
| 12 | 382 | 346 | 285 | 249 | 188 | 127 | 91 | 30 | "T" | 708 | 672 | 611 |
| 13 | 532 | 496 | 435 | 399 | 338 | 277 | 241 | 180 | 144 | 83 | 47 | "T" |
| 14 | 682 | 646 | 585 | 549 | 488 | 427 | 391 | 330 | 294 | 233 | 197 | 136 |
| 15 | 7 | "T" | 735 | 699 | 638 | 577 | 541 | 480 | 444 | 383 | 347 | 286 |
| 16 | 157 | 121 | 60 | 24 | "T" | 727 | 691 | 630 | 594 | 533 | 497 | 436 |
| 17 | 307 | 271 | 210 | 174 | 113 | 52 | 16 | "T" | 744 | 683 | 647 | 586 |
| 18 | 457 | 421 | 360 | 324 | 263 | 202 | 166 | 105 | 69 | 8 | "T" | 736 |
| 19 | 607 | 571 | 510 | 474 | 413 | 352 | 316 | 255 | 219 | 158 | 122 | 61 |
| 20 | "T" | 721 | 660 | 624 | 563 | 502 | 466 | 405 | 369 | 308 | 272 | 211 |
| 21 | 132 | 96 | 35 | "T" | 713 | 652 | 616 | 555 | 519 | 458 | 422 | 361 |
| 22 | 282 | 246 | 185 | 149 | 88 | 27 | "T" | 705 | 669 | 608 | 572 | 511 |
| 23 | 432 | 396 | 335 | 299 | 238 | 177 | 141 | 80 | 44 | "T" | 722 | 661 |
| 24 | 582 | 546 | 485 | 449 | 388 | 327 | 291 | 230 | 194 | 133 | 97 | 36 |
| 25 | 732 | 696 | 635 | 599 | 538 | 477 | 441 | 380 | 344 | 283 | 247 | 186 |
| 26 | 57 | 21 | "T" | 749 | 688 | 627 | 591 | 530 | 494 | 433 | 397 | 336 |
| 27 | 207 | 171 | 110 | 74 | 13 | "T" | 741 | 680 | 644 | 583 | 547 | 486 |
| 28 | 357 | 321 | 260 | 224 | 163 | 102 | 66 | 5 | "T" | 733 | 697 | 636 |
| 29 | 507 | 471 | 410 | 374 | 313 | 252 | 216 | 155 | 119 | 58 | 22 | "T" |
| 30 | 657 | 621 | 560 | 524 | 463 | 402 | 366 | 305 | 269 | 208 | 172 | 111 |
| 31 | 32 | "T" | 710 | 674 | 613 | 552 | 516 | 455 | 419 | 358 | 322 | 261 |

The 30000 Core information bits comprising each modem frame are coded and assembled in groups of bits from the puncture patterns, as defined previously and functionally illustrated in FIG. 4. These groupings are mapped into the Core Interleaver using the expressions presented in Table 10.

The Core Interleaver indices are defined as: k=Block Symbol Index, 0 to 749 symbols in each Core block; b=Block number, 0 to 7 within each Modem Frame; and p=PTCM bit mapping within each 64-QAM symbol, (IA=0, IB=1, IC=2, QA=3, QB=4, QC=5)

A diversity delay of three modem frames is added to the Backup signal.

The 24000 Enhancement information bits comprising each modem frame are coded and assembled in groups of bits from the puncture patterns, as defined previously and illustrated in FIG. 6. These groupings are mapped into the Enhancement Interleaver using the expressions presented in Table 11.

The Enhancement Interleaver indices k, b, p and p are defined as: k=Block Index, 0 to 750 symbols in each Core block; b=Block number, 0 to 7 within each Modem Frame;

TABLE 10

Core Interleaver Mapping

| Partition $X_{k,b,p}$ | N, n = 0 ... N − 1 | k index in block b | b block # | p I & Q, ASK mapping |
|---|---|---|---|---|
| $BU_{k,b,p}$ | 18000 | mod[n + floor(n/750), 750] | floor(n/2250) (see note 1) | mod(n,3) |
| $BL_{k,b,p}$ | 18000 | mod[n + floor(n/750) + 1, 750] | floor(n/2250) (see note 1) | mod(n,3) |
| $MU_{k,b,p}$ | 18000 | mod[n + floor(n/3000) + 2, 750] | mod(3 * n,8) | 3 + mod(n,3) |
| $ML_{k,b,p}$ | 18000 | mod[n + floor(n/3000) + 3, 750] | mod(3 * n + 3,8) | 3 + mod(n,3) | p=16-QAM bit mapping within each 16-QAM symbol, (IA=0, IB=1, QA=2, QB=3); and p=QPSK bit mapping within each QPSK symbol, (I=0, Q=1).

two training symbols (8 and 24) of 32 total; and p=16-QAM bit mapping within each 16-QAM symbol, (IA=0, IB=1, QA=2, QB=3).

TABLE 11

Hybrid Enhancement Interleaver Mapping.

| Partition $X_{k,b,p}$ | N n = 0 ... N − 1 | k index in block b | b block # | p I & Q, ASK mapping |
|---|---|---|---|---|
| $EU_{k,b,p}$ | 24000 | mod[n + floor(n/6000), 750] | mod[3 * n + floor(n/3000) + 2 * floor(n/12000), 8] | mod(n,4) |
| $EL_{k,b,p}$ | 12000 | mod[n + floor(n/6000), 750] | mod[3 * n + floor(n/3000), 8] | mod(n,2) |

A diversity delay of 2 Modem Frames is added to the Backup signal.

The 30000 All-Digital Enhancement information bits comprising each modem frame are coded and assembled in groups of bits from the puncture patterns, as defined previously and illustrated in FIG. 7. These groupings are mapped into the All-Digital Enhancement Interleaver using the expressions presented in Table 12.

The All-Digital Enhancement interleaver in this example is very similar to the Core interleaver, except that the Backup portion interleaves on frame (not block) boundaries identical to the Main portion. This necessitates a minor modification to the Core interleaver. The Core Backup Block interleaving spans the I (in-phase) QAM component, while the Main Frame interleaving spans the Q (quadrature) QAM component. In order to accommodate Frame Enhancement interleaving, the Backup I (in-phase) interleaver is made identical to the Main Q interleaver expressions. Then the Enhancement Backup Frame must be transmitted one frame ahead of the Core Backup Frame, while the Main Core and Enhancement Frames are transmitted simultaneously.

The All-Digital Enhancement Interleaver indices k, b and p are defined as: k=Block Symbol Index, 0 to 749 symbols in each block; b=Block number, 0 to 7 within each Modem Frame; and p=PTCM bit mapping within each 64-QAM symbol, (IA=0, IB=1, IC=2, QA=3, QB=4, QC=5).

TABLE 12

All-Digital Enhancement Interleaver Mapping.

| Partition $X_{k,b,p}$ | N, n = 0 ... N − 1 | k index in block b | b block # | p I & Q, ASK mapping |
|---|---|---|---|---|
| $BU_{k,b,p}$ | 18000 | mod[n + floor(n/3000) + 2, 750] | mod(3 * n,8) | mod(n,3) |
| $BL_{k,b,p}$ | 18000 | mod[n + floor(n/3000) + 3, 750] | mod(3 * n + 3,8) | mod(n,3) |
| $MU_{k,b,p}$ | 18000 | mod[n + floor(n/3000) + 2, 750] | mod(3 * n,8) | 3 + mod(n,3) |
| $ML_{k,b,p}$ | 18000 | mod[n + floor(n/3000) + 3, 750] | mod(3 * n + 3,8) | 3 + mod(n,3) |

A diversity delay of 2 or 3 modem frames is added to the Backup signal.

The 80 IDS information bits comprising each block are coded and assembled in groups of bits from the puncture patterns, as defined previously and illustrated in FIG. 7. These groupings are mapped into the Enhancement Interleaver using the expressions presented in Table 13.

The IDS Interleaver Indices k and p are defined as: k=Block Index, 0 to 29 symbols in each block, skipping the

TABLE 13

IDS Interleaver Mapping.

| Partition $X_{k,p}$ | N n = 0 ... N − 1 | k index in IDS sequence | p I & Q, ASK mapping |
|---|---|---|---|
| $IDSU_{k,p}$ | 120 | mod(n + floor(n/60),30) | mod(n,4) |
| $IDSL_{k,p}$ | 120 | mod(n + floor(n/60) + 11,30) | mod(n,4) |

Interleaving within each IDS sequence spanning 32 OFDM symbols can be performed using the following expression for the row (vector) index:

$$\text{row}(k) = \text{mod}\left[11 \cdot \left(k + floor\left(\frac{k}{15}\right)\right) + 3, 32\right]$$

$$k = 0 \ldots 29$$

The index k points to one of the 32 16-QAM symbols within the IDS sequence. Each of the 16-QAM symbols carries 4 code bits. Of the total of 32 symbols, 30 carry IDS information while the remaining 2 symbols are used for training symbols (locations 8 and 24).

A functional block diagram of the deinterleaver and FEC decoder portions of a receiver is shown in FIG. 9. The constellation data at the input is comprised of the I and Q values for each of the QAM symbols, which have been demodulated and normalized to the constellation grid. Channel State Information (CSI) is associated with each I and Q value to permit subsequent soft-decision detection of the bits. The purpose of the delay elements in the figure is to time-align the Backup audio information with the Main and Enhancement audio information, since the Main and Enhancement have been delayed at the transmitter. The MU and ML blocks of bits are accumulated in an entire modem frame prior to deinterleaving with the BU and BL blocks of bits. Blocks 208, 210, 212, 218, 236, 238, 240 and 242 in the figure indicate functions that must be processed on interleaver block boundaries (as opposed to modem frame boundaries) in order to minimize delay in processing the Backup or IDS data.

Since binary codes are used for CPTCM with nonbinary modulation, it is beneficial to obtain some sort of soft binary metrics from noisy M-ary symbols. Suppose that the received noise symbol is:

$$y_i = s_i + n_i, \quad i = 1, \ldots N$$

Assuming K information bits per symbol, the binary metric for the k-th bit is given by:

$$\lambda_{i,k} = \ln \frac{Pr(b_k = 1 | y_i)}{Pr(b_k = 0 | y_i)} = \ln \frac{\sum_{\text{all } s_j^{1,k}} f_n(y_i - s_j^{1,k})}{\sum_{\text{all } s_j^{0,k}} f_n(y_i - s_j^{0,k})}, \quad k = 1, \ldots, K$$

where $s_j^{1,k}$ stands for the j-th symbol in the constellation that has bit value 1 in the k-th bit position (and similarly for $s_j^{0,k}$, the j-th symbol in the constellation that has bit value 0 in the k-th bit) and $$f_n(x) = \frac{1}{\sqrt{2\pi\sigma^2}} \exp\left[-\frac{x^2}{2\sigma^2}\right]$$

is the probability density function of the noise, assuming AWG noise. The above formula for the soft bit metric applies for any constellation. The main disadvantage of this approach is that it requires computations of exponentials. An approximate metric can be obtained by approximating the sum of exponentials by the maximum exponential, so that $$\lambda_{i,k} \cong \ln \frac{\max_{\text{all } s_j^{1,k}} \exp\left[-\frac{1}{2\sigma_i^2}(y_i - s_j^{1,k})^2\right]}{\max_{\text{all } s_j^{0,k}} \exp\left[-\frac{1}{2\sigma_i^2}(y_i - s_j^{0,k})^2\right]}, \quad k = 1, \ldots, K$$

$$\cong \frac{1}{\sigma_i^2}\left[y_i\left(s_{\min}^{1,k} - s_{\min}^{0,k}\right) - 0.5\left(s_{\min}^{1,k\,2} - s_{\min}^{0,k\,2}\right)\right]$$

where irrelevant terms and constants are dropped and $s^{1,k}_{\min}$ denotes the symbol closest to $y_i$ that has 1 in the k-th bit position (and similarly for $s^{0,k}_{\min}$). Thus, by means of this approximation (so called log-max approximation) the calculation of exponentials is avoided. However, as a consequence of using this approximation a fraction of dB can be lost in performance.

Figure 11:
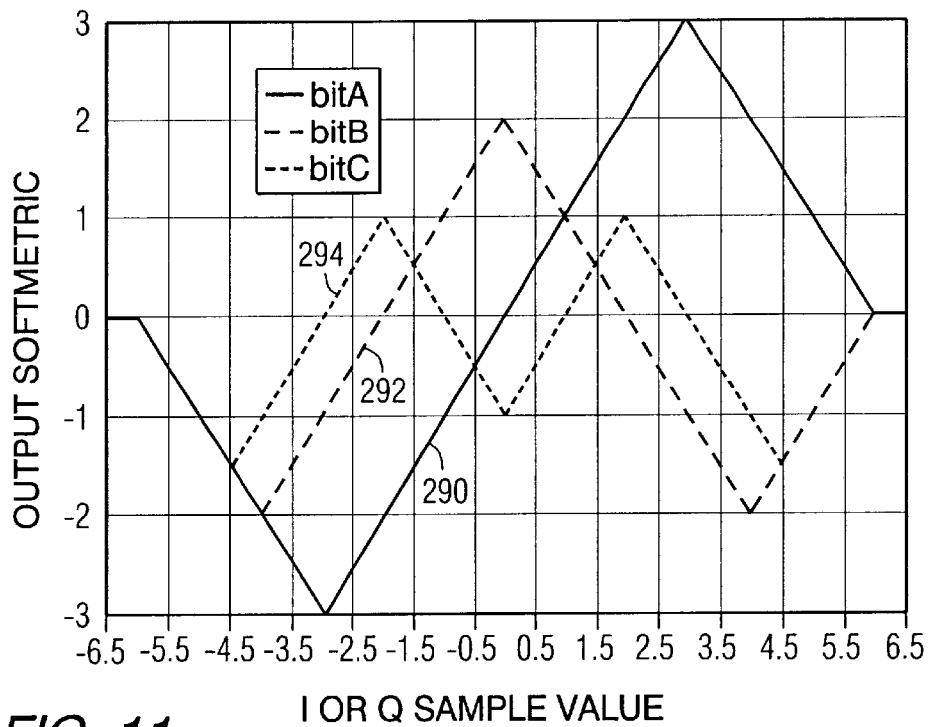
FIG. 11 is a schematic representation of a robust soft metric F(y) for an eight-amplitude shift keying (8-ASK), in-phase or quadrature component of a 64-quadrature amplitude modulated (64-QAM) signal.
Figure 12:
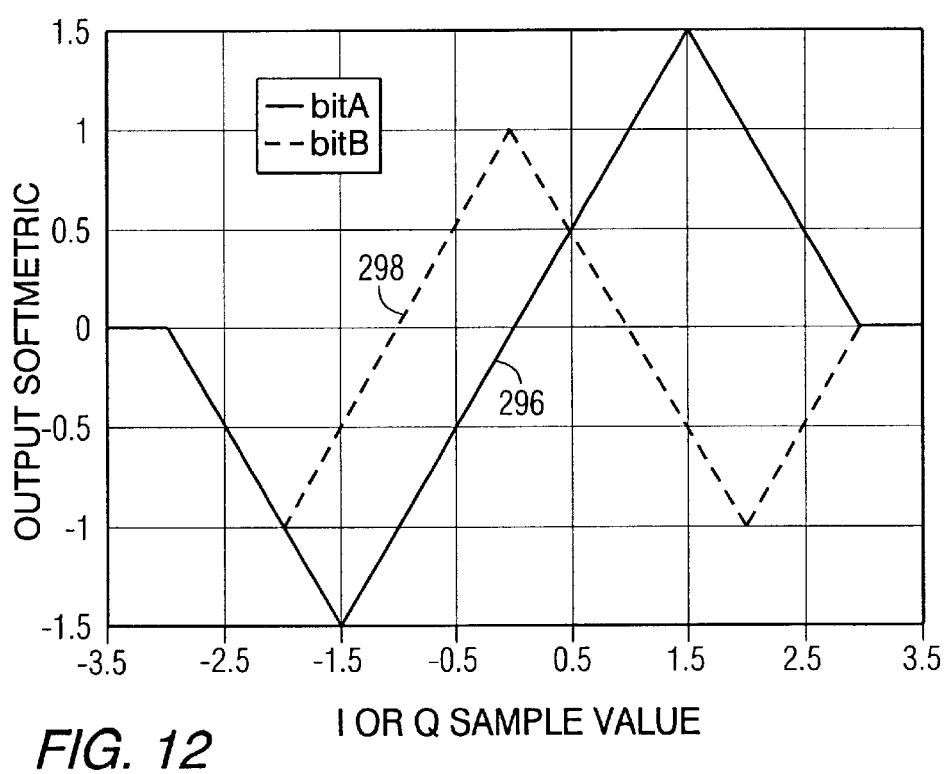
FIG. 12 is a schematic representation of a robust soft metric F(y) for a four-amplitude shift keying (4-ASK), in-phase or quadrature component of a 16 quadrature amplitude modulated (16-QAM) signal.
Figure 13:
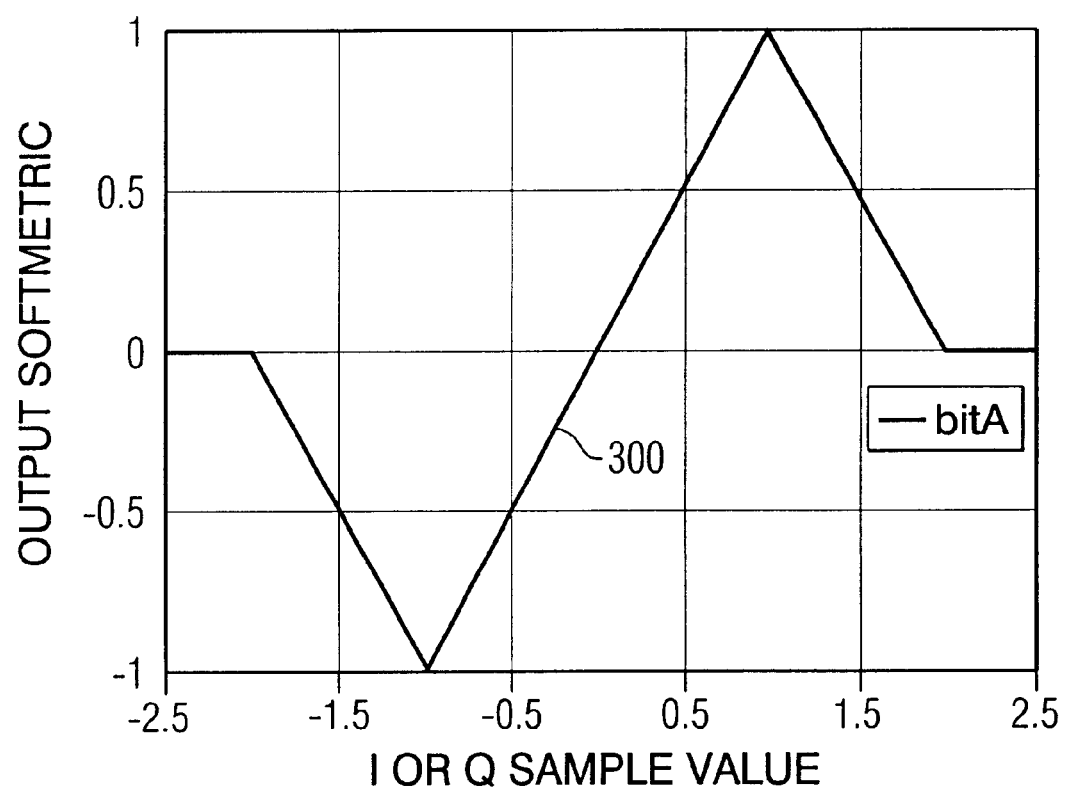
FIG. 13 is a schematic representation of a robust soft metric F(y) for a binary phase shift keying (BPSK), in-phase or quadrature component of a quadrature phase shift keying (QPSK) signal.

Consider now possible improvements of soft metric for the impulsive noise scenario. Let us assume that the noisy symbol sample is passed through a nonlinearity of the form (soft limiter or linear clipper). It is desired to construct a soft metric that performs approximately the same in AWGN as previously considered metrics, yet that will have smaller degradation in impulsive noise. That is, it has to have enough "softness" to maximize the performance in AWGN and to limit metric samples when impulsive noise is present, i.e. to prevent the excessive metric growth when large noise samples are present. Toward that goal consider the 8-ASK constellation and nonlinearities shown in FIG. 11. In FIG. 11, line 290 represents the output soft metric for bit A, line 292 represents the output soft metric for bit B, and line 294 represents the output soft metric for bit C. FIGS. 12 and 13 illustrate nonlinearities for 4-ASK and QPSK, respectively. In FIG. 12, line 296 represents the output soft metric for bit A, and line 298 represents the output soft metric for bit B. In FIG. 13, line 300 represents the output soft metric for bit A.

Based on the value of received noisy signal we construct soft metrics by processing the received samples through the different nonlinearities shown in FIGS. 11 through 13. The constructed soft bit values are further divided by the corresponding values of average noise power estimated for the symbol. In summary, the soft metric can be represented by:

$$\text{soft\_out}_i = \frac{F(y_i)}{\sigma_i^2}$$

where y represents the received noisy symbol, F(.) is the desired nonlinearity from FIGS. 11 through 13, and σ is the standard deviation of the noise.

This invention uses "Complementary Pattern-Mapped Convolutional Codes" (CPCC). These codes have the property that the original code can be segmented into multiple component codes, each of higher rate than the original code. The component codes are designed to perform well under certain interference conditions or fading in the channel. Furthermore, the code bits can be efficiently mapped onto bandwidth-efficient signals that carry more than one bit per dimension (QAM, for example).

While this invention has been described in terms of its preferred embodiments, it will be apparent to those skilled in the art that various changes can be made to the described embodiments without departing from the scope fo the invention as defined by the following claims.

What is claimed is:

1. A method of transmitting digital information comprising the steps of:
   forward error correction encoding a plurality of bits of digital information using complementary pattern-mapped convolutional codes;
   modulating a plurality of carrier signals with the forward error corrected bits; and
   transmitting the carrier signals.

2. A method according to claim 1, wherein the code partitions comprise an upper main partition, a lower main partition, an upper backup partition, and a lower backup partition, wherein the upper main partition and the lower main partition do not overlap, the upper backup partition and the lower backup partitions do not overlap, the upper backup partition overlaps first portions of both the upper main partition and the lower main partition, and the lower backup partition overlaps second portions of both the upper main partition and the lower main partition.

3. A method according to claim 1, wherein the step of forward error correction encoding the bits comprises the steps of:
   deleting predetermined bits in the plurality of bits to produce a modified plurality of bits;
   allocating the modified plurality of bits among a plurality of partitions;
   mapping in-phase and quadrature components of the modified plurality of bits to a QAM constellation;
   independently amplitude shift keying in-phase and quadrature components of the QAM constellation using Gray code mapped constellation points corresponding to a plurality of amplitude levels;
   assessing the relative value of code bits to be mapped to the constellation points; and assigning more valuable bits to most significant bits in the constellation points.

4. A method according to claim 3, wherein the code partitions comprise an upper main partition, a lower main partition, an upper backup partition, and a lower backup partition, wherein the upper main partition and the lower main partition do not overlap, the upper backup partition and the lower backup partitions do not overlap, the upper backup partition overlaps first portions of both the upper main partition and the lower main partition, and the lower backup partition overlaps second portions of both the upper main partition and the lower main partition.

5. A method according to claim 1, wherein the step of forward error correction encoding the bits comprises the steps of:
defining a plurality of code partitions;
finding noncatastrophic partition codes; and
the noncatastrophic codes to a QAM constellation.

6. A method according to claim 5, wherein the partition codes comprise punctured codes.

7. A method according to claim 5, wherein the step of modulating a plurality of carrier signals with the forward error corrected bits comprises the step of:
independently amplitude shift keying in-phase and quadrature components of the QAM constellation.

8. A method according to claim 7, wherein the step of amplitude shift keying in-phase and quadrature components of the QAM constellation uses Gray code mapped constellation points corresponding to a plurality of amplitude levels.

9. A method according to claim 8, further comprising the steps of:
assessing the relative value of code bits to be mapped to the constellation points; and
assigning more valuable bits to most significant bits in the constellation points.

10. A transmitter comprising:
means for forward error correction encoding a plurality of bits of digital information using complementary pattern-mapped convolutional codes;
means for modulating a plurality of carrier signals with the forward error corrected bits; and
means for transmitting the carrier signals.

11. A transmitter according to claim 10, wherein the complementary pattern-mapped convolutional codes comprise:
a plurality of noncatastrophic partition codes mapped to a QAM constellation.

12. A transmitter according to claim 10, wherein the means for forward error correction encoding the bits comprises:
means for deleting predetermined bits in the plurality of bits to produce a modified plurality of bits;
means for allocating the modified plurality of bits among a plurality of partitions; and
means for mapping in-phase and quadrature components of the modified plurality of bits to a QAM constellation.

13. A transmitter according to claim 10, wherein the means for modulating a plurality of carrier signals with the forward error corrected bits comprises:
means for independently amplitude shift keying in-phase and quadrature components of the QAM constellation.

14. A transmitter according to claim 13, wherein the means for independently amplitude shift keying in-phase and quadrature components of the QAM constellation uses Gray code mapped constellation points corresponding to a plurality of amplitude levels.

15. A method of receiving an information signal comprising the steps of:
receiving a plurality of carrier signals modulated by a plurality of complementary pattern-mapped convolutional coded bits;
demodulating the carrier signals to recover the complementary pattern-mapped convolutional coded bits; and
producing an output signal based on the complementary pattern-mapped convolutional coded bits.

16. A method according to claim 15, wherein the step of demodulating the carrier signals comprises the steps of:
passing the complementary pattern-mapped convolutional coded bits through a nonlinear limiter.

17. A receiver for receiving an information signal comprising:
means for receiving a plurality of carrier signals modulated by a plurality of complementary pattern-mapped convolutional coded bits;
means for demodulating the carrier signals to recover the complementary pattern-mapped convolutional coded bits; and
means for producing an output signal based on the complementary pattern-mapped convolutional coded bits.

18. A receiver according to claim 17, wherein the means for demodulating the carrier signals comprises:
means for passing the complementary pattern-mapped convolutional coded bits through a nonlinear limiter.

19. A transmitter comprising:
an encoder for forward error correction encoding a plurality of bits of digital information using complementary pattern-mapped convolutional codes;
a modulator for modulating a plurality of carrier signals with the forward error corrected bits; and
an antenna for transmitting the carrier signals.

20. A transmitter according to claim 19, wherein the complementary pattern-mapped convolutional codes comprise:
a plurality of noncatastrophic partition codes mapped to a QAM constellation.

21. A transmitter according to claim 19, wherein the encoder comprises:
a processor for deleting predetermined bits in the plurality of bits to produce a modified plurality of bits, for allocating the modified plurality of bits among a plurality of partitions, and for mapping in-phase and quadrature components of the modified plurality of bits to a QAM constellation.

22. A transmitter according to claim 19, wherein the modulator comprises:
a processor for independently amplitude shift keying in-phase and quadrature components of the QAM constellation.

23. A transmitter according to claim 22, wherein the processor for independently amplitude shift keying in-phase and quadrature components of the QAM constellation uses Gray code mapped constellation points corresponding to a plurality of amplitude levels.

24. A receiver for receiving an information signal comprising:
an antenna for receiving a plurality of carrier signals modulated by a plurality of complementary pattern-mapped convolutional coded bits;

a demodulator for demodulating the carrier signals to recover the complementary pattern-mapped convolutional coded bits; and an output for producing an output signal based on the complementary pattern-mapped convolutional coded bits.

25. A receiver according to claim 24, wherein the demodulator comprises:

a nonlinear limiter.

* * * * *